(12) United States Patent
Bartley et al.

(10) Patent No.: US 7,852,103 B2
(45) Date of Patent: Dec. 14, 2010

(54) IMPLEMENTING AT-SPEED WAFER FINAL TEST (WFT) WITH COMPLETE CHIP COVERAGE

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew Benson Maki, Rochester, MN (US); Mark Owen Maxson, Mantorville, MN (US); Dennis Martin Rickert, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 12/429,263

(22) Filed: Apr. 24, 2009

(65) Prior Publication Data
US 2010/0271046 A1  Oct. 28, 2010

(51) Int. Cl.
*G01R 31/02* (2006.01)
*G01R 31/26* (2006.01)
*H01L 23/58* (2006.01)

(52) U.S. Cl. .................. 324/765; 324/527; 324/158.1; 716/4; 438/14; 257/48

(58) Field of Classification Search ......... 324/754–765; 257/48; 438/14–18; 716/4
See application file for complete search history.

(56) References Cited

U.S. PATENT DOCUMENTS

| 7,512,915 B2 * | 3/2009 | Anand et al. ............... 716/4 |
| 2008/0210935 A1 * | 9/2008 | Ebara ........................ 257/48 |

* cited by examiner

*Primary Examiner*—Ha Tran T Nguyen
*Assistant Examiner*—Emily Y Chan
(74) *Attorney, Agent, or Firm*—Joan Pennington

(57) ABSTRACT

A method, an apparatus and a computer program product are provided for implementing At-Speed Wafer Final Test (WFT) with total integrated circuit chip coverage including high speed off-chip receiver and driver input/output (I/O) circuits. An integrated circuit (IC) chip includes off-chip Controlled Collapse Chip Connection (C4) nodes and a driver and a receiver of the off-chip receiver and driver input/output (I/O) circuits connected to respective off-chip C4 nodes. Through Silicon Vias (TSVs) are added to the connections of the driver and the receiver and the respective off-chip C4 nodes to a backside of the IC chip. A metal wire is added to the IC chip backside connecting the TSVs and creating a connection path between the driver and the receiver that is used for the at-speed WFT testing of the I/O circuits.

13 Claims, 5 Drawing Sheets

PRIOR ART

IMPLEMENTING AT-SPEED WAFER FINAL TEST (WFT) WITH COMPLETE CHIP COVERAGE

FIELD OF THE INVENTION

The present invention relates generally to testing of integrated circuit chips, and more particularly, relates to a method, apparatus, and computer program product for implementing At-Speed Wafer Final Test (WFT) total integrated circuit chip coverage including high speed off-chip receiver and driver input/output (I/O) circuits.

DESCRIPTION OF THE RELATED ART

At-speed Wafer Final Test (WFT) coverage of high-speed off-chip driver and receiver I/O circuits is currently limited. Currently there is no known solution for effectively implementing at-speed testing of the final devices of the drivers and receivers that connect to the off-chip C4 connection pads.

Controlled Collapse Chip Connection (C4) or flip chip is a method for interconnecting semiconductor devices or integrated circuit chips to external circuitry with solder bumps that have been deposited onto the chip pads. The solder bumps are deposited on the chip pads on the top side of the wafer during a final wafer processing step. The IC chip is flipped over to mount the IC chip to an external circuit on a circuit board or another chip with the solder bump wafer pads of the IC chip aligned with matching pads on the external circuit, and then the solder is flowed to complete the interconnect.

FIG. 1 illustrates a conventional testing coverage of an integrated circuit chip 100 with a region or chip portion of high speed off-chip receiver and driver input/output (I/O) circuits 102 currently not tested and internal circuitry or region 104 that is tested at-speed during wafer final testing. The untested off-chip I/O circuits 102 include a transmitter (TX) 106 and a receiver (RX) 108 connected to off-chip C4 nodes.

Internal wrap BIST engines (not shown) test internal circuitry 104, which includes a protocol link layer 110, a physical layer transmitter near pad logic 112, a physical layer receiver near pad logic 114, and a pair of multiplexers 116, 118, which is used for tapping off a functional data path at the input of the output driver 106, and the functional data path then is wired internally within the chip indicated by INTERNAL CHIP WRAP to an alternative input to the multiplexer 118 with another input of multiplexer 118 connected to the I/O receiver 108. This test data path is provided responsive to the multiplexer control input WRAP_ENABLE. DC level tests are performed on the outputs and inputs to test basic function of the I/O circuits 102. But, this method only captures basic DC defects and allows AC defects of I/O circuits 102 to be missed. This increases overall test time, test cost and potentially causes defective parts to be sent to the field.

A need exists to enable at-speed WFT coverage of the off-chip devices of high-speed I/O circuits.

SUMMARY OF THE INVENTION

Principal aspects of the present invention are to provide a method, apparatus, and computer program product for implementing At-Speed Wafer Final Test (WFT) with total integrated circuit chip coverage including high speed off-chip receiver and driver input/output (I/O) circuits. Other important aspects of the present invention are to provide such method, apparatus, and computer program product substantially without negative effect and that overcome many of the disadvantages of prior art arrangements.

In brief, a method, apparatus, and computer program product are provided for implementing At-Speed Wafer Final Test (WFT) with total integrated circuit chip coverage including high-speed off-chip receiver and driver input/output (I/O) circuits. An integrated circuit (IC) chip includes off-chip Controlled Collapse Chip Connection (C4) nodes and a driver and a receiver of the off-chip receiver and driver input/output (I/O) circuits connected to respective off-chip C4 nodes. Through Silicon Vias (TSVs) are added to the connections of the respective off-chip C4 nodes and the driver and the receiver to a backside of the IC chip. A metal wire is added to the IC chip backside connecting the TSVs and creating a connection path between the driver and the receiver that is used for the At-Speed Wafer Final Test (WFT) of the I/O circuits.

In accordance with features of the invention, after testing is completed, the metal wire on the chip backside is removed eliminating the connection between the driver and receiver.

In accordance with features of the invention, the driver and the receiver are respectively connected to one of a pair of multiplexers to provide an internal chip wrap connection to enable testing internal chip circuitry.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
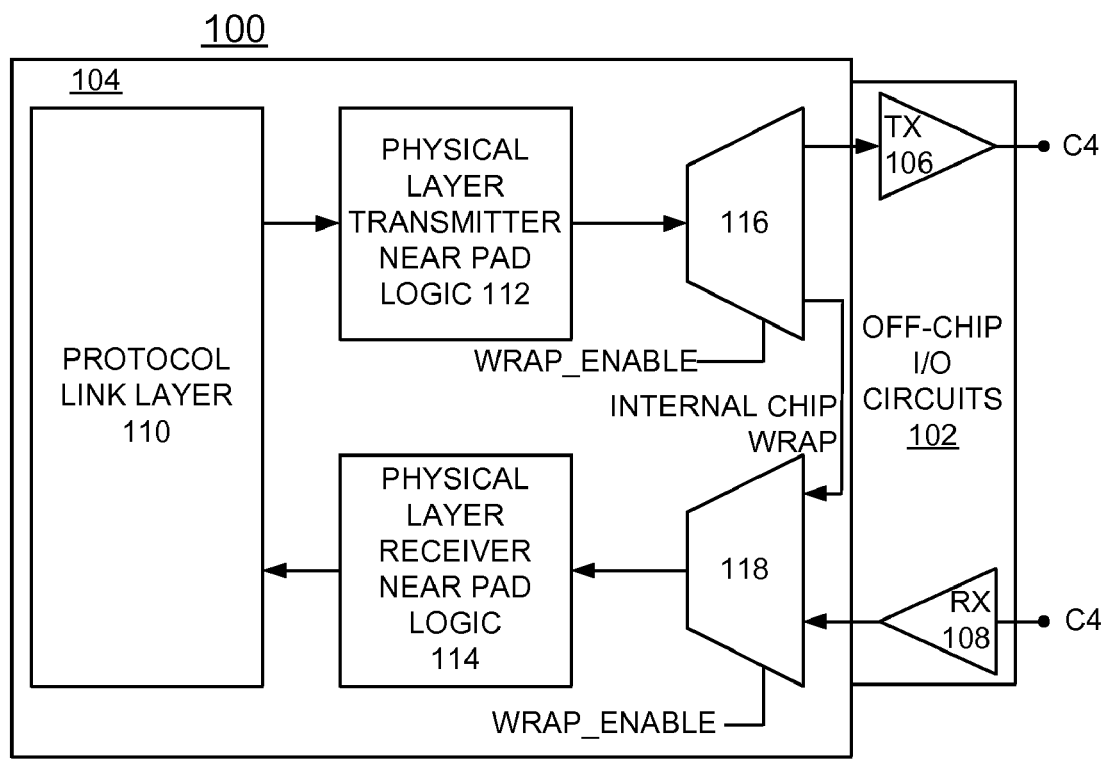
FIG. 1 is a schematic and block diagram representation illustrating a prior art testing coverage of an integrated circuit chip with high-speed off-chip receiver and driver input/output (I/O) currently not tested.
Figure 2:
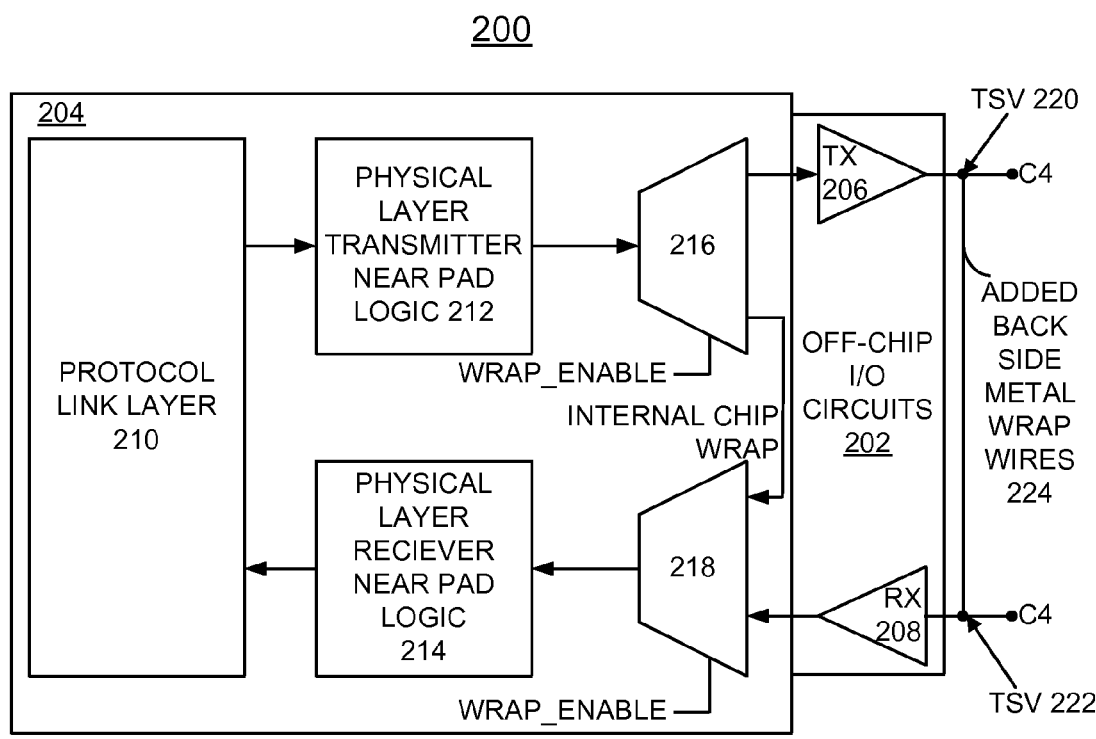
FIG. 2 is a schematic and block diagram representations illustrating an example integrated circuit chip with high-speed off-chip receiver and driver input/output (I/O) circuits for implementing optimized total integrated circuit chip coverage at-speed Wafer Final Test (WFT)

In accordance with features of the invention, a method is provided that implements at-speed Wafer Final Test (WFT) with total integrated circuit chip coverage including high speed off-chip receiver and driver input/output (I/O) circuits. A metal layer is added to a backside of the chip under test, on this metal layer, a metal wire or wires are created to wrap an output of each I/O driver or transmitter to an input of an I/O receiver. Through Silicon Vias (TSVs) are used to create a connection path to a chip backside from the C4 nodes and the respective receiver and driver connections of the I/Os. The metal wire or multiple wires are created on the metal layer on the backside of the chip completing the connection path between the receiver and driver. After testing is completed, the metal wire on the back side of the chip is removed, for example, ground away eliminating the connection or short between the I/O transmitter and receiver Having reference now to the drawings, in FIG. 2, there is shown an example integrated circuit chip generally designated by the reference character 200 for implementing total integrated circuit chip coverage At-Speed Wafer Final Test (WFT) in accordance with the preferred embodiment. At-speed WFT is enabled to provide total testing coverage of the integrated circuit (IC) chip 200 including high speed off-chip receiver and driver input/output (I/O) circuits 202 and internal chip circuitry 204 that are tested at speed during wafer final testing. The off-chip I/O circuits 202 include a driver or transmitter (TX) 206 and a receiver (RX) 208 connected to respective off-chip C4 nodes.

Internal wrap built-in self-test (BIST) engines (not shown) test the internal chip circuitry 204 including a protocol link layer 210, a physical layer transmitter near pad logic 212, a physical layer receiver near pad logic 214, and a pair of multiplexers 216, 218. The multiplexers 216, 218 are used for tapping off a functional data path at the input of the output driver TX 206, and the test data path is wired internally within the chip indicated by INTERNAL CHIP WRAP to an alternative input to multiplexer 218 instead of an input from the receiver RX 208, responsive to enabling a multiplexer control input WRAP_ENABLE. The internal chip circuitry 204 is tested at-speed during WFT such as provided in conventional WFT.

In accordance with features of the invention, off-chip I/Os portion 202 includes Through Silicon Vias (TSVs) 220, 222 and an added backside metal wire or wires 224 connected between the TSVs 220, 222. The Through Silicon Vias (TSVs) 220, 222 are respectively connected to an output of the driver TX 206 and an input of the receiver RX 208 and the respective off-chip C4 nodes, extending through the IC chip 200. The Through Silicon Vias (TSVs) 220, 222 create a connection from the C4 connections of the I/Os 202 to the added metal wires 224 that are created with a metal layer on the backside of the IC chip 200. At-speed WFT including AC and DC testing are performed on the I/O circuits 202 using the connection path between the output driver TX 206 and the input of receiver RX 208 provided by the TSVs 220, 222 and metal wires 224 in accordance with features of the invention. After at-speed WFT testing is completed, the metal wire 224 on the back side of the chip is removed eliminating the connection between the transmitter TX 206 and receiver RX 208.

Figure 3:
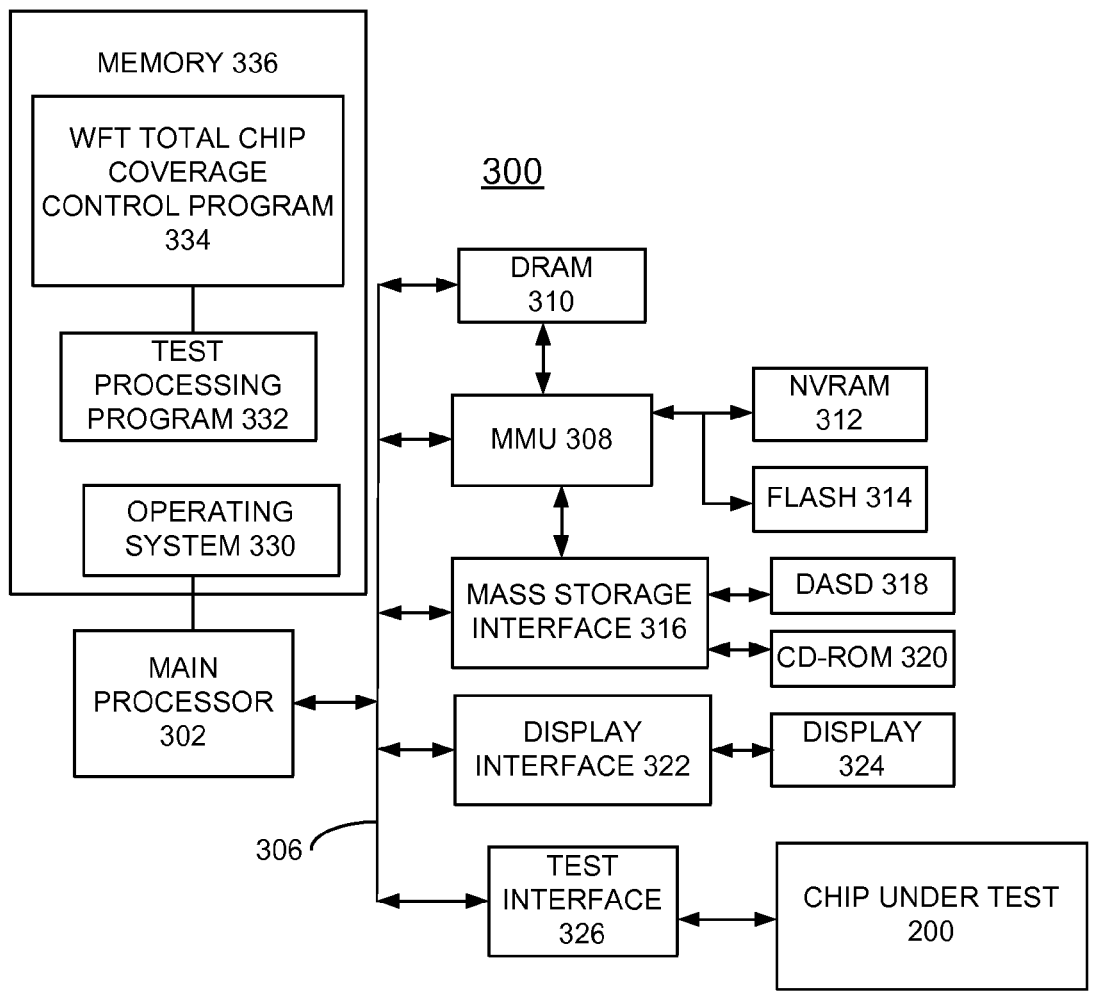
FIG. 3 is a block diagram representation illustrating an exemplary computer test system for implementing optimized At-Speed Wafer Final Test (WFT) with total integrated circuit chip coverage including high-speed off-chip receiver and driver input/output (I/O) circuits in accordance with the preferred embodiment.

Referring also to FIG. 3, there is shown an exemplary computer test system generally designated by the reference character 300 for implementing optimized at-speed WFT in accordance with the preferred embodiment. Computer system 300 includes a main processor 302 or central processor unit (CPU) 302 coupled by a system bus 306 to a memory management unit (MMU) 308 and system memory including a dynamic random access memory (DRAM) 310, a nonvolatile random access memory (NVRAM) 312, and a flash memory 314. A mass storage interface 316 coupled to the system bus 306 and MMU 308 connects a direct access storage device (DASD) 318 and a CD-ROM drive 320 to the main processor 302.

Computer system 300 includes a display interface 322 connected to a display 324, and a test interface 326 coupled to the system bus 306. The integrated circuit chip 200 under test is coupled to the test interface 326. At-speed Wafer Final Test (WFT) is preformed with total coverage of the integrated circuit chip 200 including the high speed off-chip receiver RX 108 and driver TX 206 of the input/output (I/O) circuits 202.

Computer system 300 includes an operating system 330, a test processing program 332 of the preferred embodiment, and a Wafer Final Test (WFT) total chip coverage program 334 of the preferred embodiment resident in a memory 336.

Computer test system 300 is shown in simplified form sufficient for understanding the present invention. The illustrated computer test system 300 is not intended to imply architectural or functional limitations. The present invention can be used with various hardware implementations and systems and various other internal hardware devices, for example, multiple main processors.

Figure 4:
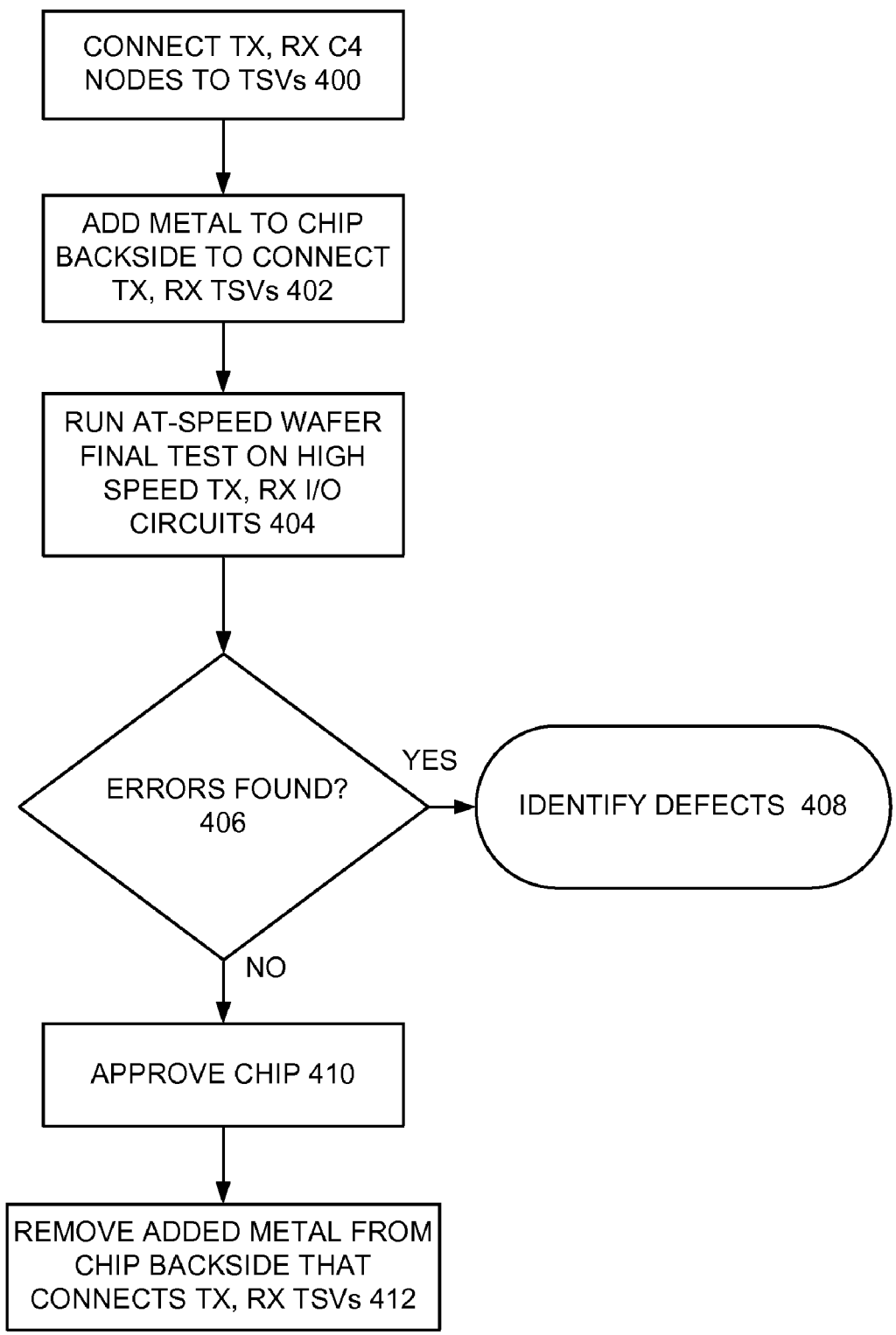
FIG. 4 is a flow chart illustrating exemplary steps for implementing optimized At-Speed Wafer Final Test (WFT) with total integrated circuit chip coverage including high speed off-chip receiver and driver input/output (I/O) circuits in accordance with the preferred embodiment.

Referring now to FIG. 4, there are shown exemplary steps for implementing optimized At-Speed Wafer Final Test (WFT) with total integrated circuit chip coverage including high speed off-chip receiver and driver input/output (I/O) circuits of the preferred embodiment. The transmit (TX) and receive (RX) and respectively connected C4 nodes are connected to Through Silicon Vias (TSVs) as indicated in a block 400 with the TSVs extending through to a backside of the IC chip 200 under test. Metal is added to the chip backside connecting the TX and RX with respective TSVs, creating a test connection as indicated in a block 402. Then running the At-Speed Wafer Final Test (WFT) on the high speed off-chip receiver and driver input/output (I/O) circuits 202 is performed as indicated in a block 404. Checking for errors found during the WFT is performed as indicated in a decision block 406. When errors are found, then the chip defects are identified as indicated in a block 408. After WFT is completed with no errors found, the chip is approved as indicated in a block 410 and the metal on the backside of the chip is removed as indicated in a block 412. Then the sequence ends or alternatively the passing chips are moved onto a next test step.

Figure 5:
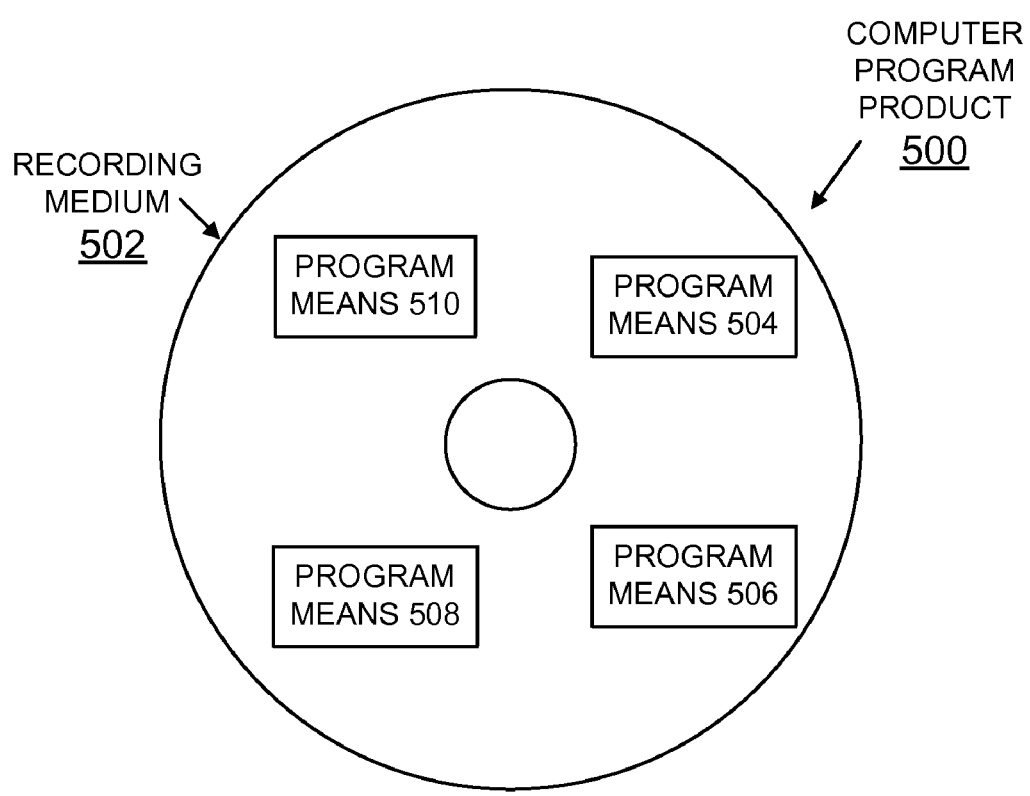
FIG. 5 is a block diagram illustrating a computer program product in accordance with the preferred embodiment.

Referring now to FIG. 5, an article of manufacture or a computer program product 500 of the invention is illustrated. The computer program product 500 is embodied in a machine readable medium and includes a recording medium 502, such as, a floppy disk, a high capacity read only memory in the form of an optically read compact disk or CD-ROM, a tape, or another similar computer program product. Recording medium 502 stores program means or instructions 504, 506, 508, 510 on the medium 502 for carrying out the methods for implementing At-Speed Wafer Final Test (WFT) with total integrated circuit chip coverage including high speed off-chip receiver and driver input/output (I/O) circuits of the preferred embodiment in the computer system 300 of FIG. 3.

A sequence of program instructions or a logical assembly of one or more interrelated modules defined by the recorded program means 504, 506, 508, 510, direct the computer system 300 for implementing optimized At-Speed Wafer Final Test (WFT) of the chip 200 under test with total integrated circuit chip coverage including high speed off-chip receiver and driver input/output (I/O) of the preferred embodiment.

While the present invention has been described with reference to the details of the embodiments of the invention shown in the drawing, these details are not intended to limit the scope of the invention as claimed in the appended claims.

What is claimed is:

1. A method for implementing At-Speed Wafer Final Test (WFT) with total integrated circuit chip coverage including high speed off-chip receiver and driver input/output (I/O) circuits, the integrated circuit (IC) chip including off-chip Controlled Collapse Chip Connection (C4) nodes and a driver and a receiver of the off-chip receiver and driver input/output (I/O) circuits respectively connected to respective off-chip C4 nodes, said method comprising the steps of:

connecting Through Silicon Vias (TSVs) to the respective connections of the driver and the receiver and the respective C4 nodes, said TSVs extending to a backside of the IC chip;

adding a metal wire to the chip backside connected to the TSVs to create a connection path between the driver and the receiver; and performing At-Speed Wafer Final Test (WFT) using the connection path between the driver and the receiver and the respective C4 nodes.

2. The method as recited in claim 1 includes removing the metal wire on the chip backside, eliminating the connection path between the driver and receiver and C4 nodes when testing is completed.

3. The method as recited in claim 1 includes providing a first multiplexer and a second multiplexer, connecting a first input of a first multiplexer to an input of the driver and connecting a first input of a second multiplexer to an output of the receiver and connecting together a second input of the first and second multiplexers.

4. The method as recited in claim 3 includes enabling a wrap enable control input to the first and second multiplexers for providing an internal chip wrap connection for testing internal chip circuitry.

5. An apparatus for implementing At-Speed Wafer Final Test (WFT) with total integrated circuit chip coverage including high speed off-chip receiver and driver input/output (I/O) circuits, the integrated circuit (IC) chip including off-chip Controlled Collapse Chip Connection (C4) nodes and a driver and a receiver of the off-chip receiver and driver input/output (I/O) circuits respectively connected to respective off-chip C4 nodes, said apparatus comprising:

a pair of Through Silicon Vias (TSVs), said TSVs being respectively connected to the driver and the receiver and the respective C4 nodes, said TSVs extending to a backside of the IC chip;

at least one metal layer on the chip backside defining a metal wire connected to the TSVs to create a connection path between the driver and the receiver; and a test system performing At-Speed Wafer Final Test (WFT) using the connection path between the driver and the receiver.

6. The apparatus for implementing At-Speed Wafer Final Test (WFT) as recited in claim 5 wherein said test system includes a Wafer Final Test (WFT) control program embodied in a machine readable medium for controlling testing by said test system.

7. The apparatus for implementing At-Speed Wafer Final Test (WFT) as recited in claim 5 further includes IC chip processing for eliminating the connection path between the driver and receiver and C4 nodes when testing is completed.

8. The apparatus for implementing At-Speed Wafer Final Test (WFT) as recited in claim 5 includes a first multiplexer and a second multiplexer, a first input of said first multiplexer connected to an input of said driver and a first input of said second multiplexer connected to an output of said receiver and a second input of said first and second multiplexers connected together.

9. The apparatus for implementing At-Speed Wafer Final Test (WFT) as recited in claim 8 includes a wrap enable control input applied to said first and second multiplexers, said wrap enable control input being enabled for providing an internal chip wrap connection for testing internal chip circuitry.

10. A computer program product embodied on a computer readable storage medium for implementing At-Speed Wafer Final Test (WFT) with total integrated circuit chip coverage including high speed off-chip receiver and driver input/output (I/O) circuits, the integrated circuit (IC) chip including off-chip Controlled Collapse Chip Connection (C4) nodes and a driver and a receiver of the off-chip receiver and driver input/output (I/O) circuits respectively connected to respective off-chip C4 nodes, said computer readable storage medium storing instructions, and said instructions when executed by the computer system cause the computer system to perform the steps comprising:

connecting Through Silicon Vias (TSVs) to the respective connections of the driver and the receiver and the respective C4 nodes, said TSVs extending to a backside of the IC chip;

adding a metal wire to the chip backside connected to the TSVs to create a connection path between the driver and the receiver; and performing At-Speed Wafer Final Test (WFT) using the connection path between the driver and the receiver and the respective C4 nodes.

11. The computer program product as recited in claim 10 further includes the step of removing the metal wire on the chip backside, eliminating the connection path between the driver and receiver and C4 nodes when testing is completed.

12. The computer program product as recited in claim 10 further includes the steps of providing a first multiplexer and a second multiplexer, connecting a first input of a first multiplexer to an input of the driver and connecting a first input of a second multiplexer to an output of the receiver and connecting together a second input of the first and second multiplexers.

13. The computer program product as recited in claim 12 further includes the steps of enabling a wrap enable control input to the first and second multiplexers for providing an internal chip wrap connection for testing internal chip circuitry.

* * * * *